(12) United States Patent
Katsunuma et al.

(10) Patent No.: US 11,955,316 B2
(45) Date of Patent: Apr. 9, 2024

(54) SUBSTRATE PROCESSING METHOD, METHOD FOR MANUFACTURING SEMICONDUCOR DEVICE, AND PLASMA PROCESSING APPARATUS

(71) Applicant: TOKYO ELECTRON LIMITED, Tokyo (JP)

(72) Inventors: Takayuki Katsunuma, Miyagi (JP); Daisuke Nishide, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 603 days.

(21) Appl. No.: 17/035,899

(22) Filed: Sep. 29, 2020

(65) Prior Publication Data

US 2021/0098234 A1    Apr. 1, 2021

(30) Foreign Application Priority Data

Oct. 1, 2019    (JP) .................................. 2019-181487

(51) Int. Cl.
| | | |
|---|---|---|
| *H01J 37/32* | (2006.01) | |
| *H01L 21/311* | (2006.01) | |
| *C23C 16/34* | (2006.01) | |
| *C23C 16/40* | (2006.01) | |

(52) U.S. Cl.
CPC .... *H01J 37/32174* (2013.01); *H01J 37/3244* (2013.01); *H01L 21/31116* (2013.01); *C23C 16/345* (2013.01); *C23C 16/401* (2013.01); *H01J 2237/332* (2013.01); *H01J 2237/334* (2013.01)

(58) Field of Classification Search
CPC ........... H01L 21/31116; H01J 37/32174; H01J 37/3244; H01J 2237/332; H01J 2237/334; C23C 16/345; C23C 16/401
See application file for complete search history.

(56) References Cited

U.S. PATENT DOCUMENTS

| | | | |
|---|---|---|---|
| 2014/0084471 A1* | 3/2014 | Peng ................... | H01L 23/5329 438/643 |
| 2015/0243522 A1 | 8/2015 | Kitagaito et al. | |
| 2016/0379834 A1 | 12/2016 | Katsunuma | |
| 2017/0125255 A1 | 5/2017 | Kakimoto et al. | |
| 2018/0130670 A1 | 5/2018 | Katsunuma | |
| 2020/0035496 A1 | 1/2020 | Kakimoto et al. | |
| 2020/0035497 A1 | 1/2020 | Kakimoto et al. | |

FOREIGN PATENT DOCUMENTS

| | | |
|---|---|---|
| JP | H10-64899 A | 3/1998 |
| JP | 2015-173240 A | 10/2015 |
| JP | 2016-021546 A | 2/2016 |
| JP | 2016-027594 A | 2/2016 |
| JP | 2017-011127 A | 1/2017 |
| TW | 201612977 A | 4/2016 |

\* cited by examiner

*Primary Examiner* — Brook Kebede
(74) *Attorney, Agent, or Firm* — XSENSUS LLP

(57) ABSTRACT

A substrate processing method includes: providing a substrate including a first region and a second region into a chamber; forming a deposit film on the first region and the second region of the substrate by generating a first plasma from a first processing gas, and selectively etching the first region with respect to the second region by generating a second plasma from the second processing gas containing an inert gas. The first processing gas is a mixed gas including a first gas containing carbon atoms and fluorine atoms and a second gas containing silicon atoms.

15 Claims, 10 Drawing Sheets

SUBSTRATE PROCESSING METHOD, METHOD FOR MANUFACTURING SEMICONDUCOR DEVICE, AND PLASMA PROCESSING APPARATUS

CROSS-REFERENCE TO RELATED APPLICATIONS

This application is based on and claims priority from Japanese Patent Application No. 2019-181487 filed on Oct. 1, 2019 with the Japan Patent Office, the disclosure of which is incorporated herein in its entirety by reference.

TECHNICAL FIELD

An exemplary embodiment of the present disclosure relates to a substrate processing method, a method for manufacturing a semiconductor device, and a plasma processing apparatus.

BACKGROUND

In manufacturing electronic devices, a processing may be performed in which, for example, a hole or a trench is formed in a silicon oxide film serving as an insulating layer by etching (see, e.g., Japanese Patent Laid-Open Publication Nos. 2017-011127, 2015-173240, and 2016-021546).

Japanese Patent Laid-Open Publication No. 2017-011127 discloses a technology related to an etching method. The method includes a step of forming a deposit containing fluorocarbon on a mask containing metal and a layer containing silicon. Further, the method includes a step of etching the layer containing silicon by radicals of the fluorocarbon contained in the deposit.

Japanese Patent Laid-Open Publication No. 2015-173240 discloses a technology related to an etching method. The method includes a step of etching a region made of silicon oxide and forming a deposit containing fluorocarbon on the region. Further, the method includes a step of etching the region by radicals of the fluorocarbon contained in the deposit.

Japanese Patent Laid-Open Publication No. 2016-021546 discloses a technology related to an etching processing. The etching processing includes a step of partially etching a silicon-containing film by a plasma and etching a silicon-containing film having a carbon-containing film by a plasma.

SUMMARY

In an exemplary embodiment, a substrate processing method is provided. The substrate processing method includes step a), step b), and step c). Step a) is a step of providing a substrate including a first region and a second region into a chamber. Step b) is a step of forming a deposit film on the first region by generating a first plasma from a first processing gas. Step c) is a step of selectively etching the first region with respect to the second region by generating a second plasma from the second processing gas containing an inert gas. The first processing gas is a mixed gas including a first gas containing carbon atoms and fluorine atoms and a second gas containing silicon atoms.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, descriptions will be made on various exemplary embodiments.

In an exemplary embodiment, a substrate processing method is provided. The substrate processing method includes step a) and step b) below. Step a) is a step of providing a substrate including a first region and a second region into a chamber. Step b) is a step of forming a deposit film on the first region by generating a first plasma from a first processing gas. The first processing gas is a mixed gas including a first gas containing carbon atoms and fluorine atoms and a second gas containing silicon atoms.

In the exemplary embodiment, the deposit film contains carbon atoms and fluorine atoms. In step b), a composition ratio of the carbon atoms and the fluorine atoms in the deposit film formed on the second region is controlled by adjusting a flow rate ratio of the first gas and the second gas.

In the exemplary embodiment, the first gas is a fluorocarbon gas and/or a hydrofluorocarbon gas.

In the exemplary embodiment, the first gas contains at least one selected from a group consisting of $C_5F_8$ gas, $C_3F_8$ gas, $C_4F_8$ gas, $C_4F_6$ gas, $CF_4$ gas, $CH_3F$ gas, $CHF_3$ gas, and $CH_2F_2$ gas.

In the exemplary embodiment, the second gas contains at least one selected from a group consisting of $SiCl_4$ gas, $SiH_4$ gas, $Si_2H_6$ gas, $SiH_2Cl_2$ gas, $Si_4H_{10}$ gas, and $Si_5H_{12}$ gas.

In the exemplary embodiment, the first region contains silicon oxide, and the second region contains silicon nitride.

In the exemplary embodiment, in step b), the flow rate of the second gas is gradually increased or decreased.

In the exemplary embodiment, the substrate processing method further includes step c) below. Step c) is a step of selectively etching the first region by generating a second plasma from the second processing gas containing an inert gas. In Step c), the first region is etched by reacting the deposit film with ions contained in the second plasma.

In the exemplary embodiment, the second processing gas is a rare gas or a nitrogen gas.

In the exemplary embodiment, a cycle including step b) and step c) is executed once or more times.

In the exemplary embodiment, a method for manufacturing a semiconductor device including the substrate processing method is provided.

In the exemplary embodiment, a plasma processing apparatus is provided. The plasma processing apparatus includes a chamber, a gas source group, a radio-frequency power source, and a controller. The gas source group is configured to supply a processing gas to the chamber. The radio-frequency power source is configured to plasma excite the processing gas supplied to the chamber by the gas source group. The controller is configured to control the gas source group and the radio-frequency power source. The controller executes a processing including step a) and step b) below. Step a) is a step of providing a substrate including a first region and a second region into a chamber. Step b) is a step of forming a deposit film on the first region by generating a plasma from a processing gas. The processing gas is a mixed gas including a first gas containing carbon atoms and fluorine atoms and a second gas containing silicon atoms.

Hereinafter, various exemplary embodiments will be described in detail with reference to the drawings. Further, in the respective drawings, like parts or corresponding parts will be designated by like reference numerals.

Figure 1:
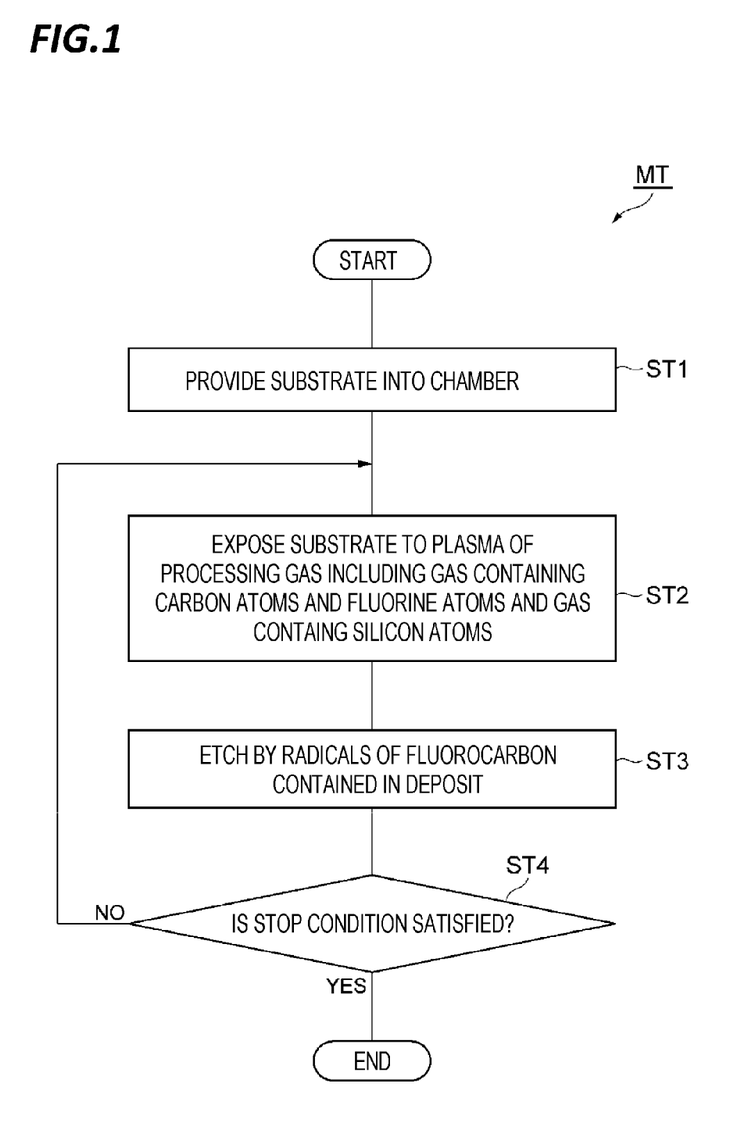
FIG. 1 is a flowchart illustrating a substrate processing method according to an exemplary embodiment.

A method MT illustrated in FIG. 1 is an exemplary embodiment of a substrate processing method applied to a method for manufacturing a semiconductor device, and is a method for etching a silicon oxide region. The method may be applied to a substrate including a first region made of silicon oxide and a second region made of silicon nitride. Specifically, the method may be applied to, for example, a case of forming a contact hole in a self-aligned contact (SAC).

Figure 2:
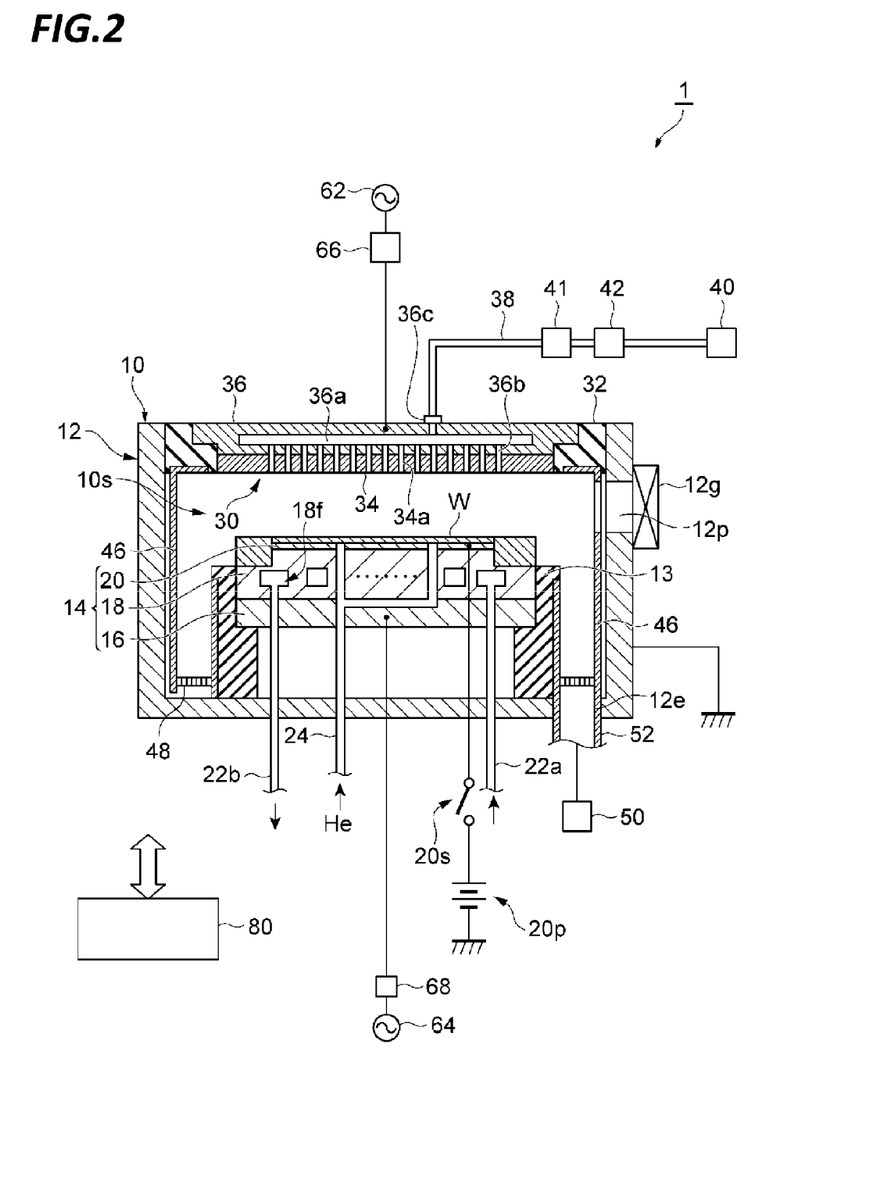
FIG. 2 is a view illustrating a configuration of a plasma processing apparatus according to an exemplary embodiment.

In the following, first, a plasma processing apparatus 1 that may be used to execute the method MT will be described with reference to FIG. 2. The plasma processing apparatus 1 illustrated in FIG. 2 is a capacitively coupled plasma etching apparatus.

The plasma processing apparatus 1 has a chamber 10. The chamber 10 provides an internal space 10s therein. The chamber 10 includes a chamber body 12. The chamber body 12 has a substantially cylindrical shape.

The chamber body 12 is made of, for example, aluminum. A film having corrosion resistance is provided on an inner wall surface of the chamber body 12. The film may be ceramics such as aluminum oxide or yttrium oxide.

A passage 12p is formed at a side wall of the chamber body 12. A substrate W is transferred between the internal space 10s and the outside of the chamber 10 through the passage 12p. The passage 12p is opened/closed by a gate valve 12g provided along the side wall of the chamber body 12.

A support 13 is provided on the bottom portion of the chamber body 12. The support 13 is made of an insulating material. The support 13 has a substantially cylindrical shape. The support 13 extends upward from the bottom portion of the chamber body 12 in the internal space 10s. The support 13 includes a support stage 14 on the upper portion.

The support stage 14 is configured to support the substrate W in the internal space 10s. The support stage 14 includes a lower electrode 18 and an electrostatic chuck 20. The support stage 14 may further include an electrode plate 16. The electrode plate 16 is made of a conductor such as aluminum, and has a substantially disc shape.

The lower electrode 18 is provided on the electrode plate 16. The lower electrode 18 is made of a conductor such as aluminum, and has a substantially disc shape. The lower electrode 18 is electrically connected to the electrode plate 16.

The electrostatic chuck 20 is provided on the lower electrode 18. The substrate W is placed on the upper surface of the electrostatic chuck 20. The electrostatic chuck 20 includes a body and an electrode. The body of the electrostatic chuck 20 has a substantially disc shape, and is made of a dielectric. The electrode of the electrostatic chuck 20 is a film-like electrode, and is provided in the body of the electrostatic chuck 20.

The electrode of the electrostatic chuck 20 is connected to a DC power source 20p via a switch 20s. When a voltage from the DC power source 20p is applied to the electrode of the electrostatic chuck 20, an electrostatic attractive force is generated between the electrostatic chuck 20 and the substrate W. The substrate W is held and supported on the electrostatic chuck 20 by the electrostatic attractive force.

An edge ring 25 is disposed on a peripheral portion of the lower electrode 18 to surround an edge of the substrate W. The edge ring 25 improves in-plane uniformity of a plasma processing on the substrate W. The edge ring 25 may be made of, for example, silicon, silicon carbide, or quartz.

A flow path 18f is provided inside the lower electrode 18. A heat exchange medium (e.g., a coolant) is supplied to the flow path 18f through a pipe 22a from a chiller unit (not illustrated) provided outside the chamber 10.

The heat exchange medium supplied to the flow path 18f returns to the chiller unit through a pipe 22b. In the plasma processing apparatus 1, the temperature of the substrate W placed on the electrostatic chuck 20 is adjusted by the heat exchange between the heat exchange medium and the lower electrode 18.

A gas supply line 24 is provided in the plasma processing apparatus 1. The gas supply line 24 supplies a heat transfer gas (e.g., He gas) from a heat transfer gas supply mechanism to a gap between the upper surface of the electrostatic chuck 20 and the rear surface of the substrate W.

The plasma processing apparatus 1 further includes an upper electrode 30. The upper electrode 30 is provided above the support stage 14. The upper electrode 30 is supported in the upper portion of the chamber body 12 through a member 32.

The member 32 is made of an insulating material. The upper electrode 30 and the member 32 close the upper opening of the chamber body 12.

The upper electrode 30 may include a ceiling plate 34 and a support body 36. A lower surface of the ceiling plate 34 is the lower surface on the internal space 10s side, and defines and forms the internal space 10s. The ceiling plate 34 may be made of a low resistance conductor or a semiconductor that generates low Joule heat. The ceiling plate 34 has a plurality of gas discharge holes 34a that penetrates the ceiling plate 34 in a plate thickness direction thereof.

The support body 36 detachably supports the ceiling plate 34. The support body 36 is made of a conductive material such as aluminum. A gas diffusion chamber 36a is provided inside the electrode support body 36. The support body 36 includes a plurality of gas holes 36b that extends downward from the gas diffusion chamber 36a.

The plurality of gas holes 36b communicate with the plurality of gas discharge holes 34a, respectively. A gas introducing port 36c is formed in the support body 36. The gas introducing port 36c is connected to the gas diffusion chamber 36a. A gas supply pipe 38 is connected to the gas introducing port 36c.

The gas supply pipe 38 is connected with a valve group 41, a flow rate controller group 42, and a gas source group 40. The gas source group 40, the valve group 41, and the flow rate controller group 42 constitute a gas supply unit. The gas source group 40 is configured to supply the first processing gas and the second processing gas (to be described later) to the chamber 10.

The gas source group 40 includes a plurality of gas sources. The valve group 41 includes a plurality of opening/closing valves. The flow rate controller group 42 includes a plurality of flow rate controllers. Each of the plurality of flow rate controllers of the flow rate controller group 42 is a mass flow controller or a pressure control type flow rate controller.

Each of the plurality of gas sources of the gas source group 40 is connected to the gas supply pipe 38 via a corresponding valve of the valve group 41 and a corresponding flow rate controller of the flow rate controller group 42.

In the plasma processing apparatus 1, a shield 46 is detachably provided along the inner wall surface of the chamber body 12 and the outer periphery of the support 13. The shield 46 prevents reaction byproducts from adhering to the chamber body 12.

The shield 46 is formed by forming a film having corrosion resistance on the surface of a base material made of, for example, aluminum. The film having corrosion resistance may be made of ceramics such as yttrium oxide.

A baffle plate 48 is provided between the support 13 and the side wall of the chamber body 12. The baffle plate 48 is formed by, for example, forming a film having corrosion resistance (e.g., a film of yttrium oxide) on the surface of a base material made of aluminum.

A plurality of through-holes is formed in the baffle plate 48. An exhaust port 12e is provided at the lower side of the baffle plate 48, and also at the bottom portion of the chamber body 12.

An exhaust device 50 is connected to the exhaust port 12e through an exhaust pipe 52. The exhaust device 50 includes a vacuum pump such as a pressure adjusting valve and a turbo molecular pump.

The plasma processing apparatus 1 has a first radio-frequency power source 62 and a second radio-frequency power source 64. The first radio-frequency power source 62 is a power source that generates a first radio-frequency power. The first radio-frequency power source 62 is configured to plasma excite the first processing gas and the second processing gas supplied to the chamber 10 by the gas source group 40.

The first radio-frequency power has a frequency suitable for plasma generation. The frequency of the first radio-frequency power is, for example, a frequency within a range of 27 MHz to 100 MHz. The first radio-frequency power source 62 is connected to the upper electrode 30 via a matcher 66 and the electrode plate 16.

The matcher 66 includes a circuit configured to match the output impedance of the first radio-frequency power source 62 and the impedance of the load side (the lower electrode 30 side). The first radio-frequency power source 62 may be connected to the lower electrode 18 via the matcher 66. The first radio-frequency power source 62 constitutes an example of a plasma generating unit.

The second radio-frequency power source 64 is a power source that generates a second radio-frequency power. The second radio-frequency power has a frequency lower than the frequency of the first radio-frequency power. When the second radio-frequency power is used together with the first radio-frequency power, the second radio-frequency power is used as a biasing radio-frequency power for drawing ions into the substrate W.

The frequency of the second radio-frequency power is, for example, a frequency within a range of 400 kHz to 13.56 MHz. The second radio-frequency power source 64 is connected to the lower electrode 18 via a matcher 68 and the electrode plate 16. The matcher 68 includes a circuit configured to match the output impedance of the second radio-frequency power source 64 and the impedance of the load side (the lower electrode 18 side).

It is possible to generate a plasma using the second radio-frequency power without using the first radio-frequency power, that is, using a single radio-frequency power. In this case, the frequency of the second radio-frequency power may be a frequency larger than 13.56 MHz, for example, 40 MHz.

The plasma processing apparatus 1 may not include the first radio-frequency power source 62 and the matcher 66. The second radio-frequency power source 64 constitutes an example of a plasma generating unit.

In the plasma processing apparatus 1, a gas is supplied to the internal space 10s from the gas supply to generate a plasma. Further, a radio-frequency electric field is generated between the upper electrode 30 and the lower electrode 18 by supplying the first radio-frequency power and/or the second radio-frequency power. The generated radio-frequency electric field generates a plasma.

The plasma processing apparatus 1 may further include a controller 80. The controller 80 may be a computer including, for example, a processor, a storage unit such as a memory, an input device, a display device, and a signal input/output interface.

The controller 80 controls each component of the plasma processing apparatus 1. In the controller 80, an operator may perform an input operation of a command using the input device to manage the plasma processing apparatus 1. Further, in the controller 80, the operation status of the plasma processing apparatus 1 may be visualized and displayed by the display device.

Further, a control program and a recipe data are stored in the storage unit. The control program is executed by the processor, in order to execute various processings in the plasma processing apparatus 1. The processor executes the control program and controls each component of the plasma processing apparatus 1 according to the recipe data.

Particularly, the controller 80 is configured to control, for example, the gas source group 40 and the first radio-frequency power source 62. The controller 80 execute the method MT illustrated in the flowchart in FIG. 1 by controlling, for example, the gas source group 40 and the first radio-frequency power source 62.

More specifically, for example, as described later (see the method MT illustrated in FIG. 1), the controller 80 provides the substrate W including a first region R1 containing silicon oxide and a second region R2 containing silicon nitride illustrated in FIG. 3 into the chamber 10. Thereafter, the controller 80 is configured to control the gas source group 40 and the first radio-frequency power source 62 so as to form a deposit DP on the first region R1 by generating the first plasma from the first processing gas. The method MT executed by the controller 80 will be illustrated below.

The method MT will be described in detail with reference to FIG. 1. The method MT includes steps ST1, ST2, ST3, and ST4. The method MT may proceed the etching of the silicon oxide with a good selectivity by alternately repeating step ST2 and step ST3.

Figure 3:
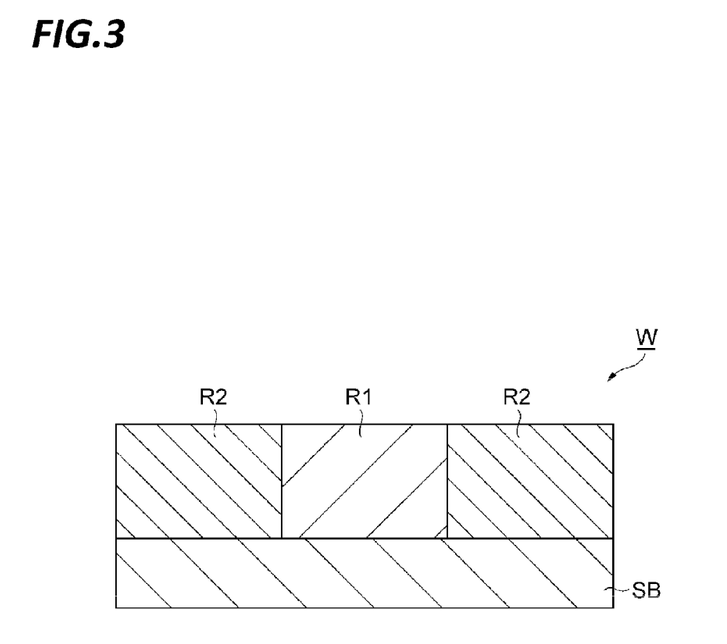
FIG. 3 is a view illustrating a cross section of a substrate to which the flowchart illustrated in FIG. 1 is applied.

In the embodiment, the method MT uses the substrate W illustrated in FIG. 3 as a processing target, and may selectively etch a partial region of the substrate W. Specifically, the substrate W illustrated in FIG. 3 includes a substrate SB, the first region R1, and the second region R2. The substrate SB is a base substrate for the first region R1 and the second region R2.

The first region R1 contains silicon oxide, and the second region R2 contains silicon nitride. In the embodiment, the first region R1 is made of silicon oxide ($SiO_2$), and the second region R2 is made of silicon nitride ($Si_3N_4$).

The first region R1 and the second region R2 are regions that are exposed to a plasma at the same time. In the embodiment, the method MT is executed to selectively etch the first region R1 with respect to the second region R2. Hereinafter, the method MT will be described assuming the substrate W illustrated in FIG. 3 as a processing target.

In step ST1, the substrate W including the first region R1 and the second region R2 is provided into the chamber 10.

In step ST2 subsequent to step ST1, the substrate W is exposed to the first plasma of the first processing gas. More specifically, in step ST2, the first plasma is generated by exciting the first processing gas, and the substrate W is exposed to the generated first plasma. In step ST2, the deposit DP (deposit film) is formed on the first region R1 and the second region R2 by generating the first plasma. The operation of each component of the plasma processing apparatus 1 at the time of execution of step ST2 may be controlled by the controller 80.

The first plasma is generated from the first processing gas. The first processing gas is a mixed gas including a first gas containing carbon atoms and fluorine atoms and a second gas containing silicon atoms. The deposit DP contains carbon atoms and fluorine atoms.

The first gas is a fluorocarbon gas and/or a hydrofluorocarbon gas. The first gas contains, for example, at least one selected from a group consisting of $C_5F_8$ gas, $C_3F_8$ gas, $C_4F_8$ gas, $C_4F_6$ gas, $CF_4$ gas, $CH_3F$ gas, $CHF_3$ gas, and $CH_2F_2$ gas. The first gas may further contain at least one of various rare gases such as Ar gas and He gas. The first gas may further contain 02 gas.

The second gas contains, for example, at least one selected from a group consisting of $SiCl_4$ gas, $SiH_4$ gas, $Si_2H_6$ gas, $SiH_2Cl_2$ gas, $Si_4H_{10}$ gas, and $Si_5H_{12}$ gas.

When executing step ST2 using the plasma processing apparatus 1, the first processing gas is supplied into the chamber body 12 from the gas source group 40. In step ST2, the radio-frequency power from the first radio-frequency power source 62 is supplied to the upper electrode 30. In step ST2, the radio-frequency bias power from the second radio-frequency power source 64 may be supplied to the lower electrode 18.

In step ST2, the pressure of the internal space 10s of the chamber body 12 is set to a predetermined pressure by the exhaust device 50.

As described above, the first plasma is generated from the first processing gas in the chamber body 12, and the substrate W placed on the support stage 14 is exposed to the first plasma. As a result, the deposit containing carbon atoms and fluorine atoms (fluorocarbon) adheres in the first region R1. Therefore, the deposit DP containing fluorocarbon is formed on the first region R1 and the second region R2. As a result, in step ST3 (to be described), it is possible to proceed the etching of the first region R1 while protecting the second region R2 by the deposit DP.

As described above, the first processing gas includes the second gas containing silicon atoms. As a result, when the first plasma is generated from the first processing gas, excessive fluorine atoms react with silicon atoms in the plasma vapor phase and are removed by the reaction represented by the following formula (1).

$$Si+4F \rightarrow SiF_4 \uparrow \tag{1}$$

As a result, it is possible to form the deposit DP having a high ratio (C/F ratio) of the composition of carbon atoms to the composition of the fluorine atoms on the first region R1 and the second region R2. It is possible to control the C/F ratio of the deposit DP by adjusting the flow rate ratio of the first gas and the second gas. For example, the C/F ratio of the deposit DP may be increased by increasing the flow rate ratio of the second gas to the first gas.

In step ST3 subsequent to step ST2, the first region R1 is etched by generating the second plasma. More specifically, the first region R1 is etched by radicals of the fluorocarbon contained in the deposit DP. The operation of each component of the plasma processing apparatus 1 at the time of execution of step ST3 may be controlled by the controller 80.

The second plasma is generated from the second processing gas, and the second processing gas contains an inert gas. In step ST3, the substrate W after the processing of step ST2 is exposed to the plasma of the inert gas. The inert gas used in step ST3 may be a rare gas or a nitrogen gas.

The processing time of step ST2 and the processing time of step ST3 are set arbitrarily. In the embodiment, the proportion occupied by the processing time of step ST2 in the total of the processing time of step ST2 and the processing time of step ST3 is set to the proportion, for example, within a range of 5 to 45%.

When executing step ST3 using the plasma processing apparatus 1, an inert gas is supplied from the gas source group 40. In step ST3, in addition to an inert gas, $O_2$ gas may be supplied.

In step ST3, the radio-frequency power from the first radio-frequency power source 62 is supplied to the upper electrode 30. In step ST3, the radio-frequency bias power from the second radio-frequency power source 64 may be supplied to the lower electrode 18.

In step ST3, the pressure of the space of the chamber body 12 is set to a predetermined pressure by the exhaust device 50.

In the method MT, after executing step ST3, step ST2 is executed again (step ST4: NO). As described above, the cycle including step ST2 and step ST3 may be executed once or more times. The film thickness of the deposit DP is reduced by the execution of the preceding step ST3. Thus, when step ST2 is executed and the substrate W is exposed to the first plasma of the first processing gas described above, the first region R1 may be further etched. Thereafter, step ST3 is further executed, and thus, the first region R1 may be etched by the fluorocarbon radicals in the deposit DP.

In the method MT, it is determined in step ST4 whether a stop condition is satisfied. It is determined that the stop condition is satisfied, for example, when the number of times the cycle including step ST2 and step ST3 is repeated reaches a predetermined number. When the stop condition is not satisfied (step ST4: NO), the cycle including step ST2 and step ST3 is executed again. When the stop condition is satisfied (step ST4: YES), the method MT is ended.

In the method MT described above, it is possible to selectively etch the first region R1 with respect to the second region R2 with a high selectivity by alternately executing step ST2 and step ST3 a plurality of times.

Figure 4:
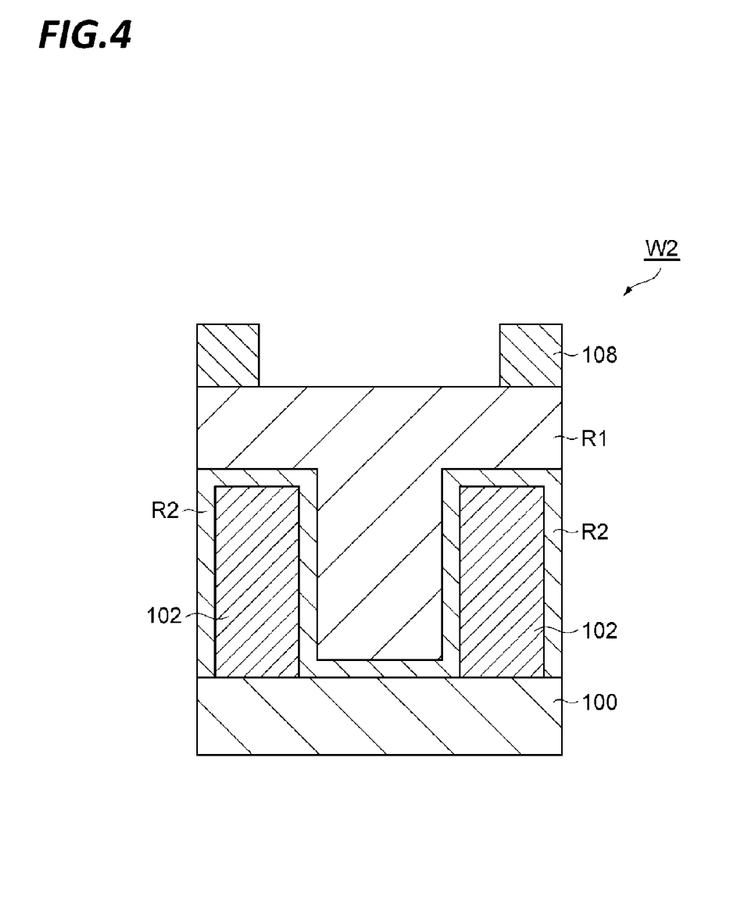
FIG. 4 is a view illustrating another example of a cross section of a substrate to which the flowchart illustrated in FIG. 1 is applied.

FIG. 4 is a cross-sectional view illustrating another example of the processing target of the method MT. The substrate illustrated in FIG. 4 is a substrate W2 including the first region R1 and the second region R2, and the method MT may be used for the substrate W2. Specifically, the substrate W2 includes a base layer 100, a plurality of convex regions 102, the first region R1, the second region R2, and a mask 108. For example, the substrate W2 is a product obtained during the manufacturing of a fin-type field effect transistor.

The base layer 100 is made of, for example, polycrystalline silicon. The base layer is a fin region in the example, and has a substantially rectangular parallelepiped shape.

The plurality of convex regions 102 are provided on the base layer 100, and are arranged substantially parallel with each other. The convex regions 102 are, for example, gate regions.

The material of the second region R2 is silicon nitride. The second region R2 is provided to cover the convex regions 102.

The convex regions 102 are embedded in the first region R1. That is, the first region R1 is provided to cover the convex regions 102 via the second region R2.

The material of the first region R1 is silicon oxide. The mask 108 is provided on the first region R1. The mask 108 has a pattern that is opened above a gap between the adjacent convex regions 102. The mask 108 is an organic film. The mask 108 may be manufactured by photolithography.

When the method MT is executed on the substrate W2, the first region R1 of the substrate W2 may be selectively etched with respect to the second region R2. A hole may be formed in a self-aligned contact (SAC) manner in the region between two adjacent convex regions 102. The hole may serve as, for example, a contact hole that is connected to a source or drain of the fin region.

More specifically, in step ST1, the substrate W2 illustrated in FIG. 4 is provided into the chamber 10. Subsequent to step ST1, step ST2 described above is executed. The first processing gas used in step ST2 is a gas of the gas species described above with respect to the first processing gas. The pressure of the internal space 10s used in step ST2 is the pressure described above with respect to the pressure of the internal space 10s in step ST2. The deposit DP is formed on the first region R1 of the substrate W2 by the execution of step ST2.

Subsequent to step ST2, step ST3 described above is executed. The second processing gas used in step ST3 is a gas of the gas species described above with respect to the second processing gas. The pressure of the internal space 10s used in step ST3 is the pressure described above with respect to the pressure of the internal space 10s in step ST3. The fluorocarbon radicals in the deposit DP formed on the substrate W2 proceed the etching of the first region R1 of the substrate W2 by the execution of step ST3.

With respect to the substrate W2, when it is determined that the stop condition is not satisfied in step ST4 described above (step ST4: NO), step ST2 is executed again after step ST3 is executed. As described above, the cycle including step ST2 and step ST3 may be executed once or more times with respect to the substrate W2.

Figure 5:
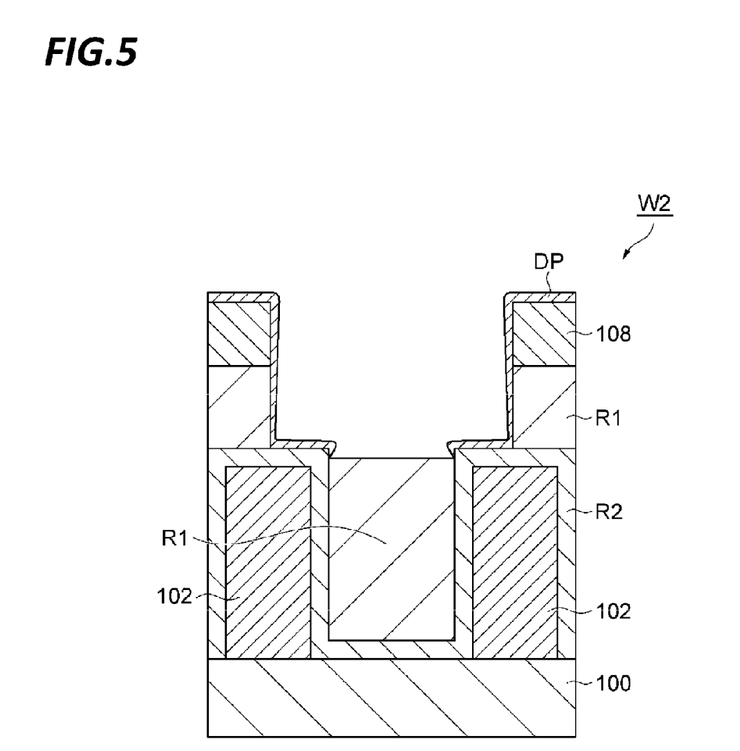
FIG. 5 is a view illustrating a cross section of the substrate after the flowchart illustrated in FIG. 1 is applied to the substrate illustrated in FIG. 4.

As described above, by repeatedly executing step ST2 and step ST3 with respect to the substrate W2, as illustrated in FIG. 5, the first region R1 is etched along the pattern of the mask 108 to reach the second region R2.

When the second region R2 is exposed by repeatedly executing step ST2 and step ST3, the deposit DP is formed on the second region R2 by step ST2, and the second region R2 is protected from the etching by the deposit DP.

Figure 6:
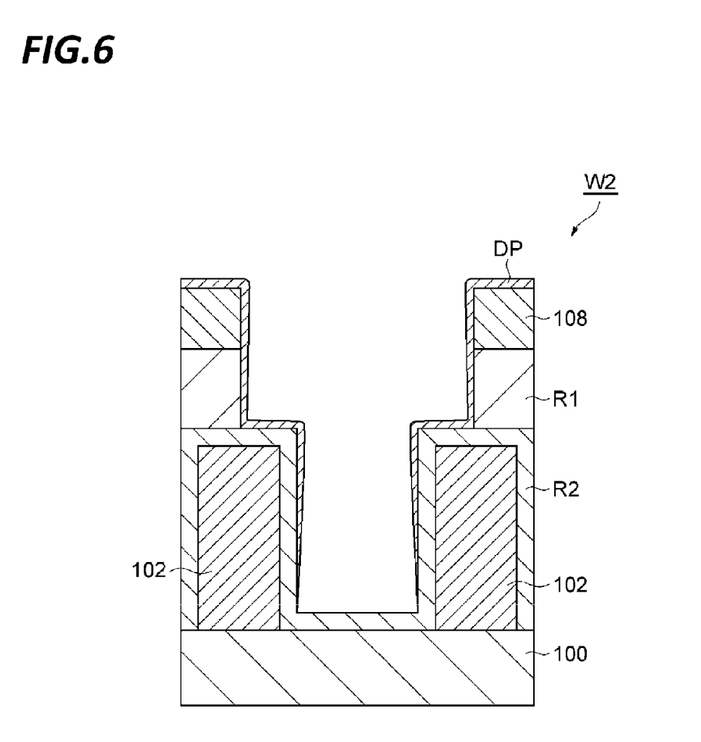
FIG. 6 is a view illustrating a cross section of the substrate after the flowchart illustrated in FIG. 1 is applied to the substrate illustrated in FIG. 5.

Further, by repeatedly executing step ST2 and step ST3, as illustrated in FIG. 6, the first region R1 between two adjacent convex regions 102 is selectively etched with respect to the second region R2 to reach the bottom surface of the recess defined by the second region R2. The convex regions 102 are protected from the etching by the deposit DP on the second region R2.

Hereinafter, a plurality of experimental examples performed for evaluation of the method MT will be described. The plurality of experimental examples described below are presented merely to illustrate the method MT, and does not limit the method MT.

In the plurality of experimental examples according to the method MT, a substrate having a configuration in which a 30-mm square $SiO_2$ chip (silicon oxide film) and a 30-mm square SiN chip (silicon nitride film) are attached on a substrate having a resist film on the surface is provided. The $SiO_2$ chip corresponds to the first region R1, and the SiN chip corresponds to the second region R2. The two chips are attached at an equal distance from the center of the substrate. The processing of the plurality of experimental examples is performed on the substrate under processing conditions disclosed below.

In the plurality of experimental examples, a cycle including step ST2 of two seconds, and step ST3 of N seconds (N is a positive integer) is executed 30 times. In the plurality of experimental examples, the execution time (N seconds) of step ST3 is any time ($5 \leq N \leq 25$) of 5 to 25 seconds (see the horizontal axis in FIG. 7). The plurality of experimental examples are different from each other in the difference in the execution time of step ST3.

Figure 7:
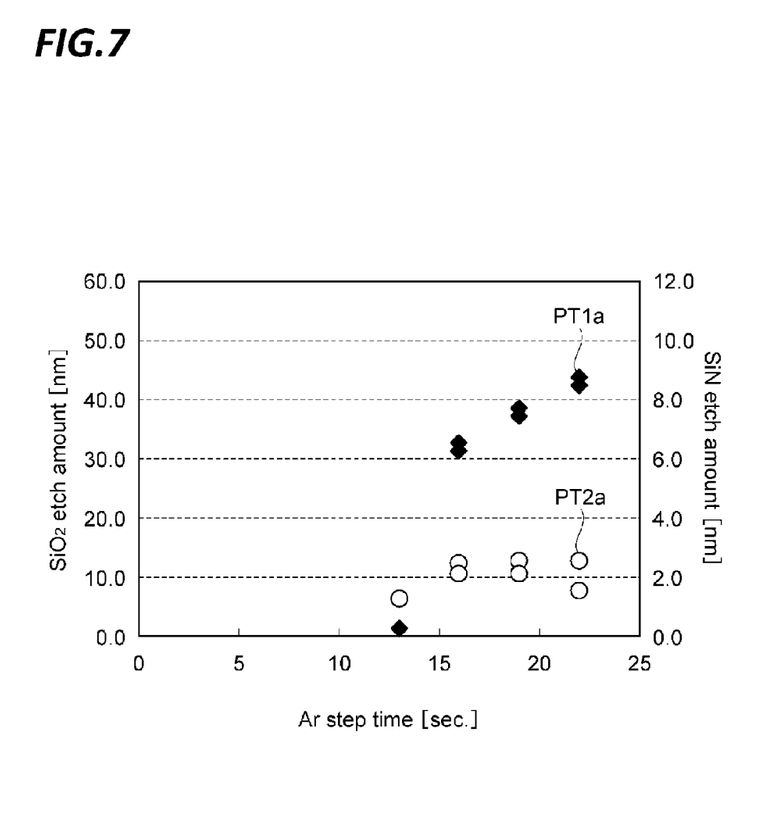
FIG. 7 is a view illustrating results obtained by a plurality of experimental examples to which the flowchart illustrated in FIG. 1 is applied.

The first gas of the first processing gas used in step ST2 is a mixed gas of $C_4F_6$ gas and Ar gas. The second gas of the first processing gas used in step ST2 is $SiCl_4$ gas. The processing conditions of step ST2 include pressure: 20 mTorr, $C_4F_6$ gas flow rate: 4 sccm, Ar gas flow rate: 1,188 sccm, and $SiCl_4$ gas flow rate: 2 sccm. The processing conditions of step ST2 are include radio-frequency power of the first radio-frequency power source 62: 60 MHz, 100 W, radio-frequency power of the second radio-frequency power source 64: 40 MHz, 150 W, and DC voltage: −300 V.

The inert gas of the second processing gas used in step ST3 is Ar gas. The processing conditions of step ST3 include pressure: 20 mTorr and Ar gas flow rate: 1,188 sccm. The processing conditions of step ST3 include radio-frequency power of the first radio-frequency power source 62: 60 MHz, 100 W, radio-frequency power of the second radio-frequency power source 64: 40 MHz, 150 W, and DC voltage: 0 V.

FIG. 7 illustrates a graph related to the results obtained by the plurality of experimental examples. In FIG. 7, the etching amount of the $SiO_2$ chip and the etching amount of the SiN chip in step ST3 are illustrated. The horizontal axis in FIG. 7 illustrates the total processing time of step ST3.

The vertical axis on the left side in FIG. 7 illustrates the etching amount of the $SiO_2$ chip in step ST3. PT1a in FIG. 7 indicates the measurement result of the etching amount of the $SiO_2$ chip. The vertical axis on the right side in FIG. 7 illustrates the etching amount of the SiN chip in step ST3. PT2a in FIG. 7 indicates the measurement result of the etching amount of the SiN chip.

Figure 8:
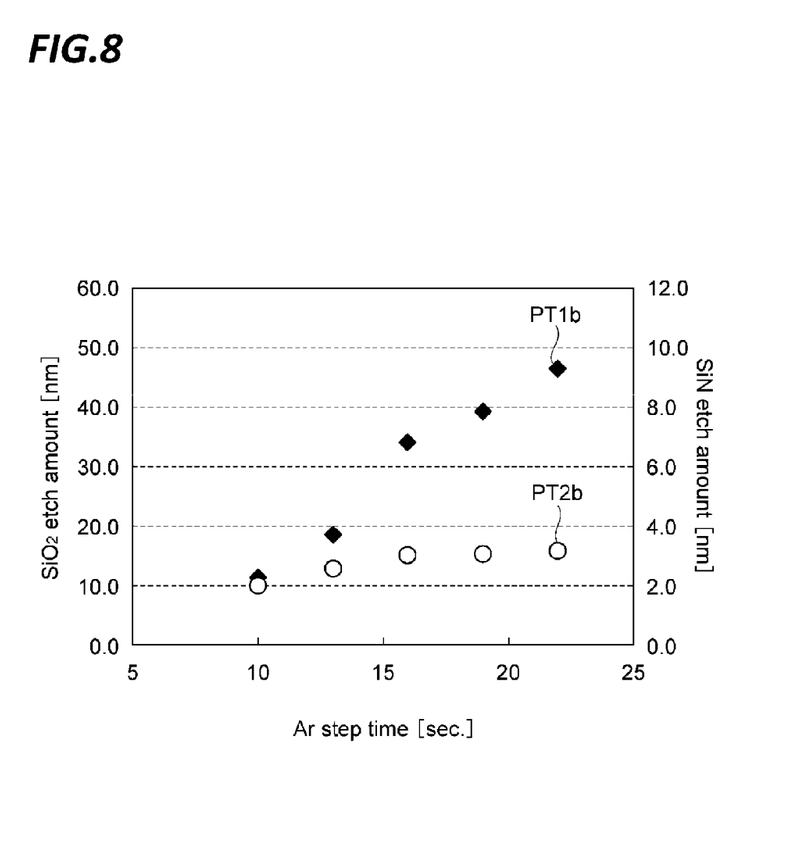
FIG. 8 is a view illustrating results obtained by a plurality of other experimental examples.

In FIG. 8, results obtained by experimental examples corresponding to the experimental examples (experimental examples according to the method MT) illustrated in FIG. 7 are illustrated. In the experimental examples in FIG. 8, two steps respectively corresponding to step ST2 and step ST3 in the experimental examples in FIG. 7 are performed.

In a step corresponding to step ST2 (hereinafter, referred to as "step ST2a") among two steps in the experimental examples in FIG. 8, a processing gas that does not contain $SiCl_4$ gas (i.e., processing gas containing $C_4F_6$ gas and Ar gas) is used. The experimental examples in FIG. 8 are different in the above aspect from the experimental examples in FIG. 7.

The horizontal axis, the vertical axis on the left side, and the vertical axis on the right side in FIG. 8 are the same as those in FIG. 7. PT1b in FIG. 8 indicates the measurement result of the etching amount of the $SiO_2$ chip. PT2b in FIG. 8 indicates the measurement result of the etching amount of the SiN chip.

As illustrated in FIG. 7, in any of the experimental examples in FIG. 7 and the experimental examples in FIG. 8, the result is obtained that the etching amount of the $SiO_2$ chip increases as the total processing time of step ST3 increases, and the etching amount of the SiN chip remains constant with a small amount.

Further, the average value of the etching amount of the SiN chip is 2.3 nm in the case illustrated in FIG. 7, and is 3.1 nm in the case illustrated in FIG. 8. That is, in the experimental example in which $SiCl_4$ gas is used in step ST2, the etching amount of the SiN chip is small as compared with the experimental example in which $SiCl_4$ gas is not used in step ST2a.

Therefore, according to the method MT, it is possible to selectively etch the first region R1 made of $SiO_2$ with respect to the second region R2 made of SiN with a relatively high selectivity. The result may be proved by the result illustrated in FIG. 9.

Figure 9:
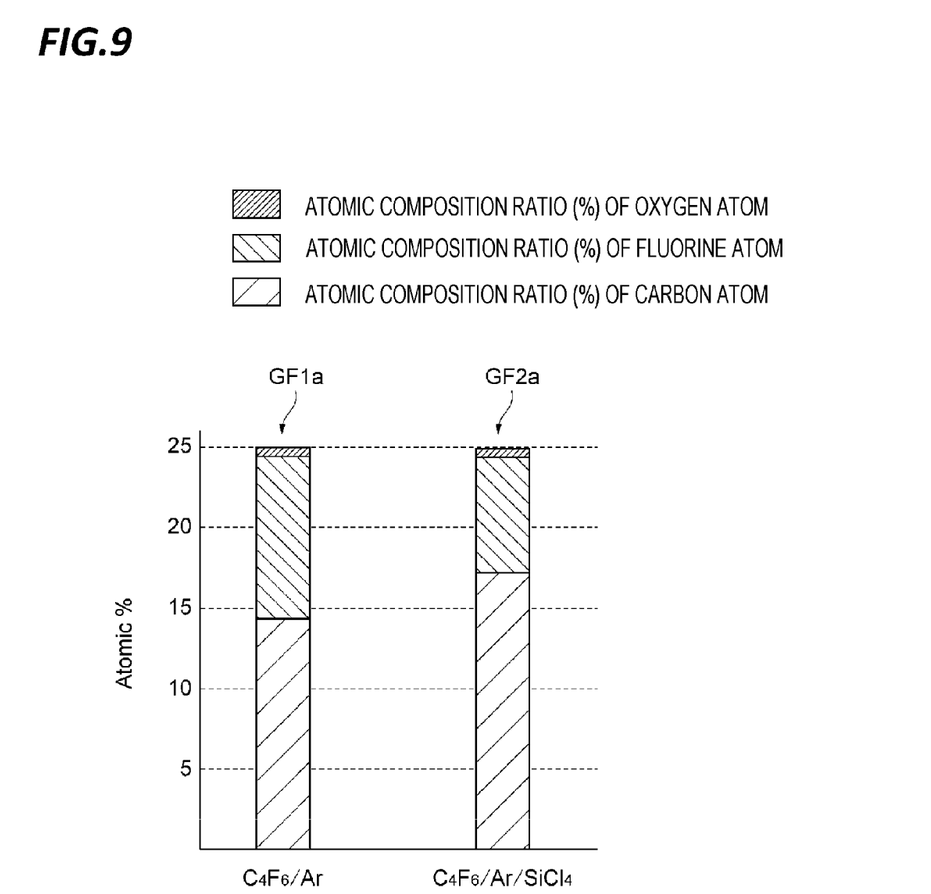
FIG. 9 is a view illustrating experimental results that may be used to understand the results illustrated in FIG. 7.

FIG. 9 illustrates atomic composition ratio (%) of the deposit DP respectively formed on the SiN chip (corresponding to the second region R2) by executing step ST2 for 90 seconds and step ST2a for 90 seconds.

The vertical axis in FIG. 9 illustrates the atomic composition ratio (%). GF1a illustrated in FIG. 9 illustrates the result obtained by step ST2a (the case where the mixed gas of $C_4F_6$ gas and Ar gas is used in the first processing gas) for 90 seconds. GF2a illustrated in FIG. 9 illustrates the result obtained by step ST2 (the case where the mixed gas of $C_4F_6$ gas, Ar gas, and $SiCl_4$ gas is used in the first processing gas) for 90 seconds.

According to the result illustrated in FIG. 9, it may be seen that the C/F ratio of the deposit DP is large in the experimental example where $SiCl_4$ gas is used in step ST2 as compared with the experimental example where $SiCl_4$ gas is not used in step ST2a. It may be considered that the result is caused by the fact that, when the plasma is generated from the first processing gas, excessive fluorine atoms react with silicon atoms in the plasma vapor phase and are removed.

According to the method MT, when $SiCl_4$ gas is used in the second gas in step ST2, the C/F ratio of the deposit DP on the second region R2 is finely controlled by adjusting the flow rate of the second gas. As a result, the resistance of the deposit DP to etching is increased, and thus, it is possible to selectively etch the first region R1 with respect to the second region R2 with a high selectivity.

Figure 10:
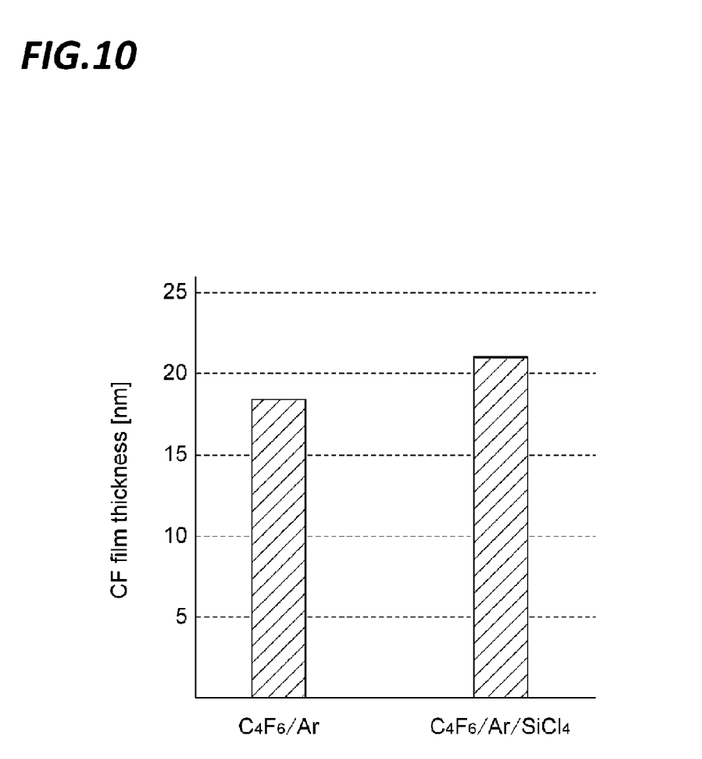
FIG. 10 is a view illustrating other experimental results that may be used to understand the results illustrated in FIG. 7.

Further, FIG. 10 illustrates the film thickness of the deposit DP respectively formed on the SiN chip by executing step ST2 for 90 seconds and step ST2a for 90 seconds.

According to FIG. 10, the film thickness of the deposit DP formed on the SiN chip is thick in the experimental example where $SiCl_4$ gas is used in step ST2 as compared with the experimental example where $SiCl_4$ gas is not used in step ST2a.

Although various exemplary embodiments have been described above, the present disclosure is not limited to the exemplary embodiments described above, and various omissions, substitutions, and changes may be made. Further, it is possible to combine elements in different exemplary embodiments to form other exemplary embodiments.

For example, the flow rate of the second gas used in step ST2 may be gradually increased or decreased as step ST2 and step ST3 are repeated. As an example, the flow rate of the second gas is decreased each time step ST2 is repeated from the initial execution of step ST2. The reason is that, as step ST2 is repeated, the removal of fluorine atoms from a degenerated region TR of the second region R2 by the plasma of silicon atoms in the second gas is proceeded.

According to the present disclosure, a technology capable of improving a selectivity in an etching processing may be provided.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A method for processing a substrate comprising:
   (a) providing a substrate including a first region and a second region into a chamber;
   (b) forming a deposit film on the first region and the second region of the substrate by generating a first plasma from a first processing gas; and
   (c) etching the first region by generating a second plasma from a second processing gas containing an inert gas,
   wherein the first processing gas is a mixed gas including a first gas containing carbon atoms and fluorine atoms and a second gas containing silicon atoms.

2. The method according to claim 1, wherein the deposit film contains carbon atoms and fluorine atoms, and
   in (b), a composition ratio of the carbon atoms and the fluorine atoms in the deposit film formed on each of the first region and the second region is controlled by adjusting a flow rate ratio of the first gas and the second gas.

3. The method according to claim 2, wherein the ratio of the composition ratio of the carbon atoms to the composition ratio of the fluorine atoms in the deposit film is increased b increasing the flow rate ratio of the second gas to the first gas.

4. The method according to claim 1, wherein the first gas is at least one of a fluorocarbon gas and a hydrofluorocarbon gas.

5. The method according to claim 1, wherein the first gas contains at least one selected from a group consisting of $C_5F_8$ gas, $C_5F_8$ gas, $C_4F_8$ gas, $C_4F_6$ gas, $CF_4$ gas, $CH_3F$ gas, $CHF_3$ gas, and $CH_2F_2$ gas.

6. The method according to claim 1, wherein the second gas contains at least one selected from a group consisting of $SiCl_4$ gas, $SiH_4$ gas, $Si_2H_6$ gas, $SiH_2C_{12}$ gas, $Si_4H_{10}$ gas, and $Si_5H_{12}$ gas.

7. The method according to claim 1, wherein the first region contains silicon oxide, and the second region contains silicon nitride.

8. The method according to claim 7, wherein, in (c), the first region is etched by reacting the first region with ions contained in the second plasma.

9. The method according to claim 1, wherein the second processing gas is a rare gas or a nitrogen gas.

10. The method according to claim 1, wherein a cycle including (b) and (c) is repeated once or more times.

11. The method according to claim 10, wherein the flow rate of the second gas is gradually increased or decreased as the cycle is repeated.

12. The method according to claim 10, wherein the flow rate of the second gas is gradually decreased as the cycle is repeated.

13. The method according to claim 1, wherein a proportion occupied by a processing time of (b) in a total of a processing time of (b) and (c) is set to a range of 5% to 45%.

14. A method for processing a substrate comprising:
 (a) providing a substrate including a first region and a second region into a chamber; and
 (b) forming a deposit film on the first region and the second region of the substrate by generating a first plasma from a first processing gas,
 wherein the first processing gas is a mixed gas including a first gas containing carbon atoms and fluorine atoms and a second gas containing silicon atoms.

15. A method for manufacturing a semiconductor device including the substrate processing method according to claim 1.

* * * * *